United States Patent
Can et al.

(10) Patent No.: US 10,715,157 B2
(45) Date of Patent: Jul. 14, 2020

(54) METHODS AND MOBILE COMMUNICATION DEVICES FOR PERFORMING SPUR RELOCATION FOR PHASE-LOCKED LOOPS

(71) Applicant: Intel Corporation, Santa Clara, CA (US)

(72) Inventors: Basak Can, Santa Clara, CA (US); Balvinder S. Bisla, San Jose, CA (US)

(73) Assignee: Apple Inc., Cupertino, CA (US)

( * ) Notice: Subject to any disclaimer, the term of this patent is extended or adjusted under 35 U.S.C. 154(b) by 347 days.

(21) Appl. No.: 15/087,398

(22) Filed: Mar. 31, 2016

(65) Prior Publication Data

US 2017/0288850 A1 Oct. 5, 2017

(51) Int. Cl.
*H03L 7/18* (2006.01)
*H03L 7/183* (2006.01)

(52) U.S. Cl.
CPC .......... *H03L 7/183* (2013.01); *H03L 2207/50* (2013.01)

(58) Field of Classification Search
CPC ....... H04L 7/0331; H04L 7/042; H03L 7/091; H03L 7/093; H03L 7/0991; H03L 7/1974; H03L 7/183; H03L 2207/50
See application file for complete search history.

(56) References Cited

U.S. PATENT DOCUMENTS

| | | | |
|---|---|---|---|
| 6,414,555 B2 * | 7/2002 | Staszewski | H03L 7/18 327/105 |
| 6,469,553 B1 * | 10/2002 | Sung | G06F 1/04 327/147 |
| 7,038,509 B1 | 5/2006 | Zhang | |
| 7,940,099 B2 | 5/2011 | Weltin-Wu et al. | |
| 8,255,733 B1 * | 8/2012 | Bartel | G06F 1/10 331/10 |
| 8,344,770 B2 * | 1/2013 | Fukuda | H03L 7/085 327/156 |

(Continued)

FOREIGN PATENT DOCUMENTS

JP 2004236141 A 8/2004

OTHER PUBLICATIONS

International Search Report and Written Opinion for PCT/US2017/020255, dated May 24, 2017, 12 pages.

*Primary Examiner* — Freshteh N Aghdam
(74) *Attorney, Agent, or Firm* — Kowert, Hood, Munyon, Rankin & Goetzel, P.C.

(57) ABSTRACT

A mobile communication device adapted to perform spur relocation for a digital phase-locked loop includes a receiver to determine a first frequency channel of interest and to identify a first frequency command word corresponding to the first frequency channel of interest. The mobile communication device further includes control logic circuitry to identify a first frequency at which a first fractional spur associated with the first frequency command word starts to occur and to determine whether the identified first frequency is within the first frequency channel of interest. In addition, the mobile communication device includes a programmable feedback divider configured to change the first frequency command word to a second frequency command word, wherein a second fractional spur associated with the second frequency command word occurs at a second frequency outside the first frequency channel of interest.

17 Claims, 6 Drawing Sheets

(56) References Cited

U.S. PATENT DOCUMENTS

| | | |
|---|---|---|
| 8,830,001 B2 | 9/2014 | Zhuang et al. |
| 9,214,947 B2 | 12/2015 | Mendel |
| 2004/0085103 A1 | 5/2004 | Ahn et al. |
| 2009/0085622 A1 | 4/2009 | Shen et al. |
| 2011/0121873 A1* | 5/2011 | Chien .................. H03L 7/1976 327/156 |
| 2012/0074995 A1 | 3/2012 | Zhang |
| 2016/0020776 A1* | 1/2016 | Kuo ....................... H03L 7/093 327/156 |
| 2017/0134030 A1* | 5/2017 | Mofidi .................... H03L 7/104 |

\* cited by examiner

METHODS AND MOBILE COMMUNICATION DEVICES FOR PERFORMING SPUR RELOCATION FOR PHASE-LOCKED LOOPS

TECHNICAL FIELD

This disclosure relates to the field of mobile communication devices and, in particular, to spur relocation for phase-locked loops in mobile communication devices.

BACKGROUND

Phase-locked loops (PLL) are control systems that generate signals having a fixed relation to the phase of a reference signal. Typically, a phase-locked loop circuit responds to both the frequency and the phase of input signals, raising or lowering the frequency of a controlled oscillator until an oscillator signal is matched with a reference signal in both frequency and phase. Phase-locked loops are widely used in radio, telecommunications, computers, and other electronic applications.

BRIEF DESCRIPTION OF THE DRAWINGS

The present disclosure is illustrated by way of example, and not by way of limitation, in the figures of the accompanying drawings.

DETAILED DESCRIPTION

Figure 1:
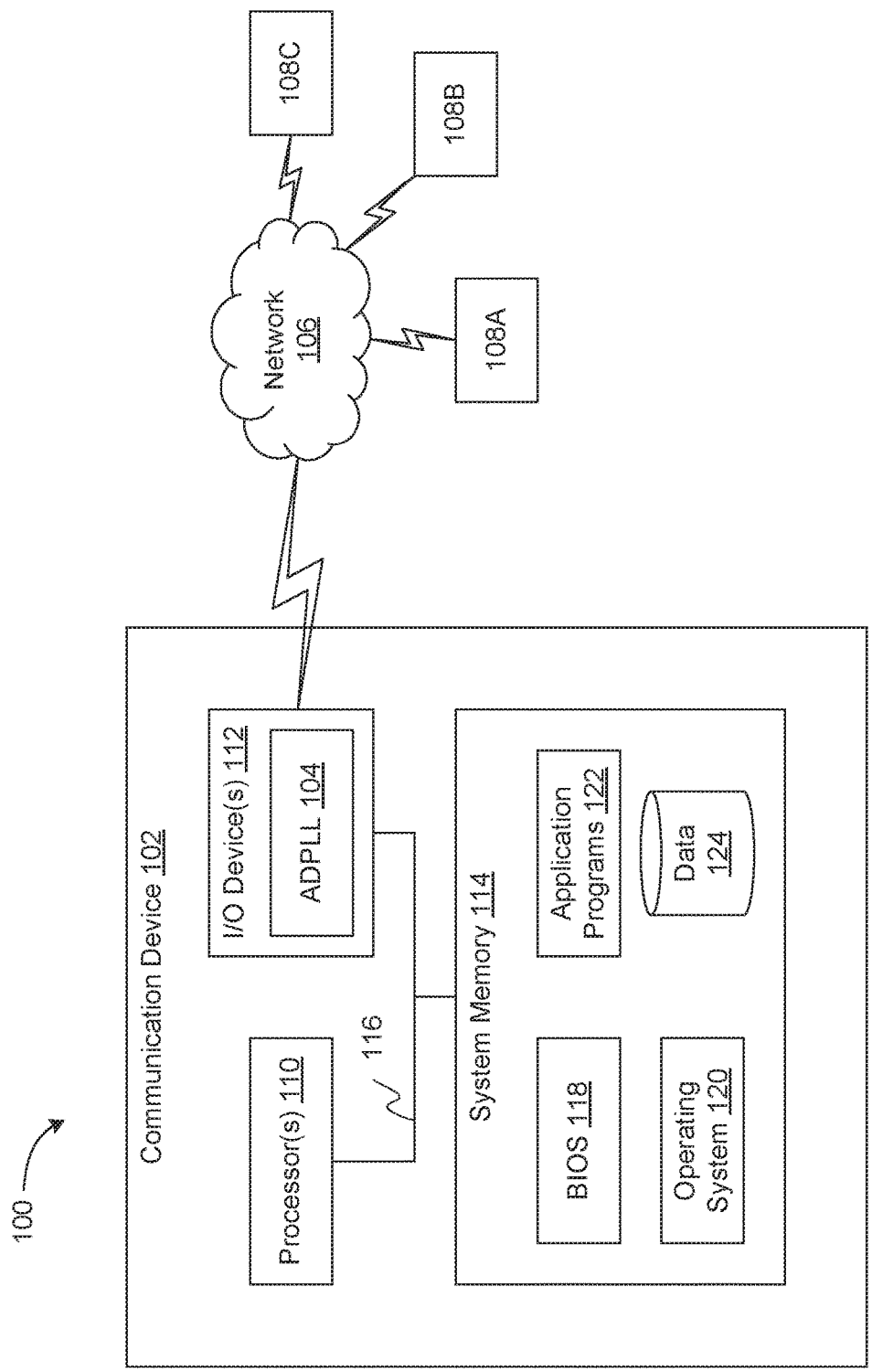
FIG. 1 is a block diagram illustrating an exemplary computing environment in which spur relocation for phase-locked loops may be implemented.

The following description sets forth numerous specific details such as examples of specific systems, components, methods, and so forth, in order to provide a good understanding of several implementations of the present disclosure. It will be apparent to one skilled in the art, however, that at least some implementations of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Described herein is a method and system for spur relocation for a phase-locked loop (PLL) in a mobile communication device. In an all-digital phase-locked loop (ADPLL), a frequency command word (FCW) is used to represent a ratio between a digitally controlled oscillator (DCO) frequency and a crystal (XTAL) frequency, which may also be referred to as a reference frequency. The XTAL frequency is typically fixed in the device, meaning that the FCW changes based on the desired DCO frequency/channel to be synthesized. Depending on the channel frequency and the resulting fractionality in the FCW (attributable to the ratio referred to above), spurious signals can be generated at certain frequencies relative to the DCO frequency. Spurious signals (i.e., "spurs") are radio frequency emissions not deliberately created or transmitted. Examples of spurs may include, harmonic emissions, parasitic emissions, intermodulation products, frequency conversion products, etc. If these spurs occur in the frequency channel currently being used for communications, performance can be degraded. Accordingly, in certain implementations, the ADPLL described herein may change the locations of the fractional spurs without changing either the DCO frequency or the XTAL frequency. As a result, the same frequency channel can be synthesized without the presence of the fractional spurs within the channel. The spurs can be moved to more preferable offsets from the center of the frequency band such that modulation fidelity or other related performance metrics can be improved.

The analytical model described herein estimates the locations of the expected spurs for a given frequency command word. Control logic in the ADPLL uses this model to find a preferable frequency command word for which the expected spurs will be outside of the frequency channel under consideration. The proposed architecture of the ADPLL can change the digital frequency command word, and hence move the fractional spurs somewhere else preferable for improved performance, without changing either the DCO frequency or the XTAL frequency. This dynamic control is based on a programmable feedback divider used in the ADPLL. The feedback divider values are determined by the control logic for each individual channel such that the frequency command word can be adjusted to a preferred value throughout the frequency synthesis to generate the desired channel frequency.

Conventional schemes focus on spur mitigation techniques which reduce the magnitude of the spur at a given location. These techniques, however, cannot completely eliminate the fractional spurs which may cause some residual performance degradation. Such techniques can also be quite sophisticated and may involve the addition of additional hardware to the system, such as a notch filter or high speed dithering (e.g., Delta-Sigma noise shaping) mechanism. This may increase the current consumption and the size of the components in the product.

In contrast, the techniques described herein change the locations of the spurs for improved performance without the need for such sophisticated spur mitigation algorithms. For example, in a given frequency channel, if one or more spurs are falling within the modulation bandwidth, then the modulation fidelity will be degraded. In implementations, the control logic can move the spurs to more preferable locations which do not cause such performance degradation. For example, the in-band spurs can be moved out of band for a given frequency channel. The preferred fractional spur locations for each frequency channel can be determined by the new analytical model presented herein and used in control logic decisions. This scheme avoids the spurs rather than mitigating them, thereby saving considerable processing power and resources.

In addition, relocating the factional spurs can help increase the maximum output power of a device by moving the spurs to preferable locations in terms of Tx-Mask compliance or modulation fidelity. It can also improve the receiver sensitivity of the devices by moving the spurs out of the bandwidth of the receive signal. It can further help to improve the performance in, for example, a 2.4 GHz ISM band for dual-band (e.g., WiFi and Bluetooth) modems. For example, the spurs generated by the Bluetooth modulation can be moved out of the bandwidth of the desired WiFi signal, depending on the channel separation between the two carriers.

Spurs created by the local oscillator of a radio may degrade a radio's transmit and receive signal fidelity, which in turn reduces the distance that such information can be communicated. Additionally, with multiple radios being integrated to form multi-radio system-on-a-chip (SOC) systems, spurs can degrade the performance and range of "neighboring" radios. The intelligent shifting of spurs allows for improvement not only in the main radio but also in other radios in the same system.

FIG. 1 is a block diagram illustrating an exemplary computing environment 100 in which spur relocation for phase-locked loops may be implemented. For example, environment 100 may be implemented in wireless communication systems, mobile communication systems, Bluetooth communication systems, and so on. In one implementation, the environment 100 includes a communication device 102, or other mobile and/or electronic devices, having one or more digital phase locked-loop circuits 104 configured in accordance with the teachings of the present disclosure to allow spur relocation. The ADPLL circuit 104 may include components that operate to provide spur relocation, as described below. The communication device 102 operatively communicates via one or more networks 106, such as wireless local area network (WLAN), with a plurality of other devices 108 (A, B and C). Alternatively, the communication device 102 may bypass the network 106 and communicate directly with one or more of the other devices 108 (A, B and C).

In the representative environment 100, the communication device 102 is a hand-held device, such as an Moving Picture Experts Group Layer-3 (MP3) player, a personal data assistant (PDA), a global positioning system (GPS) unit, mobile telephone, smartphone, or other similar hand-held device, and the other devices 108 (A, B and C) may include, for example, a computer, another hand-held device, a compact disc (CD) or digital video disc (DVD) player, a signal processor (e.g., radio, navigational unit, television, etc.), or a mobile phone. In other implementations, the devices 102 and 108 (A, B and C) may include any other suitable devices, and it is understood that any of the plurality of devices 102 and 108 (A, B and C) may be equipped with ADPLL 104 that operates in accordance with the teachings of the present disclosure.

As further shown in FIG. 1, the communication device 102 includes one or more processors 110 and one or more input/output (I/O) devices 112 (e.g., transceivers, transmitters, receivers, etc.) coupled to a system memory 114 by a bus 116. In the implementation shown in FIG. 1, the ADPLL 104 is included as a component within the I/O device 112 of the communication device 102. In alternate implementations, however, the ADPLL 104 may be integrated with any other suitable portion of the device 102, or may be a separate, individual component of the device 102.

The system bus 116 of the communication device 102 represents any of several types of bus structures, including a memory bus or memory controller, a peripheral bus, an accelerated graphics port, and a processor or local bus using any of a variety of bus architectures. The I/O component 112 may be configured to operatively communicate with one or more external networks 106, such as a cellular telephone network, a satellite network, an information network (e.g., Internet, intranet, cellular network, cable network, fiber optic network, LAN, WAN, etc.), an infrared or radio wave communication network, or any other suitable network.

The system memory 114 may include computer-readable media configured to store data and/or program modules for implementing the techniques disclosed herein that are immediately accessible to and/or presently operated on by the processor 110. For example, the system memory 114 may also store a basic input/output system (BIOS) 118, an operating system 120, one or more application programs 122, and program data 124 that can be accessed by the processor 110 for performing various tasks desired by a user or program of the communication device 102.

Moreover, the computer-readable media included in the system memory 114 can be any available media that can be accessed by the device 102, including computer storage media and communication media. Computer storage media may include volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, which can be used to store the desired information and which can be accessed by the communication device 102.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 102 may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for the present disclosure. Similarly, the device 102 is simply one non-limiting example of a suitable device that may include an ADPLL 104 configured for spur relocation in accordance with the present disclosure.

Figure 2:
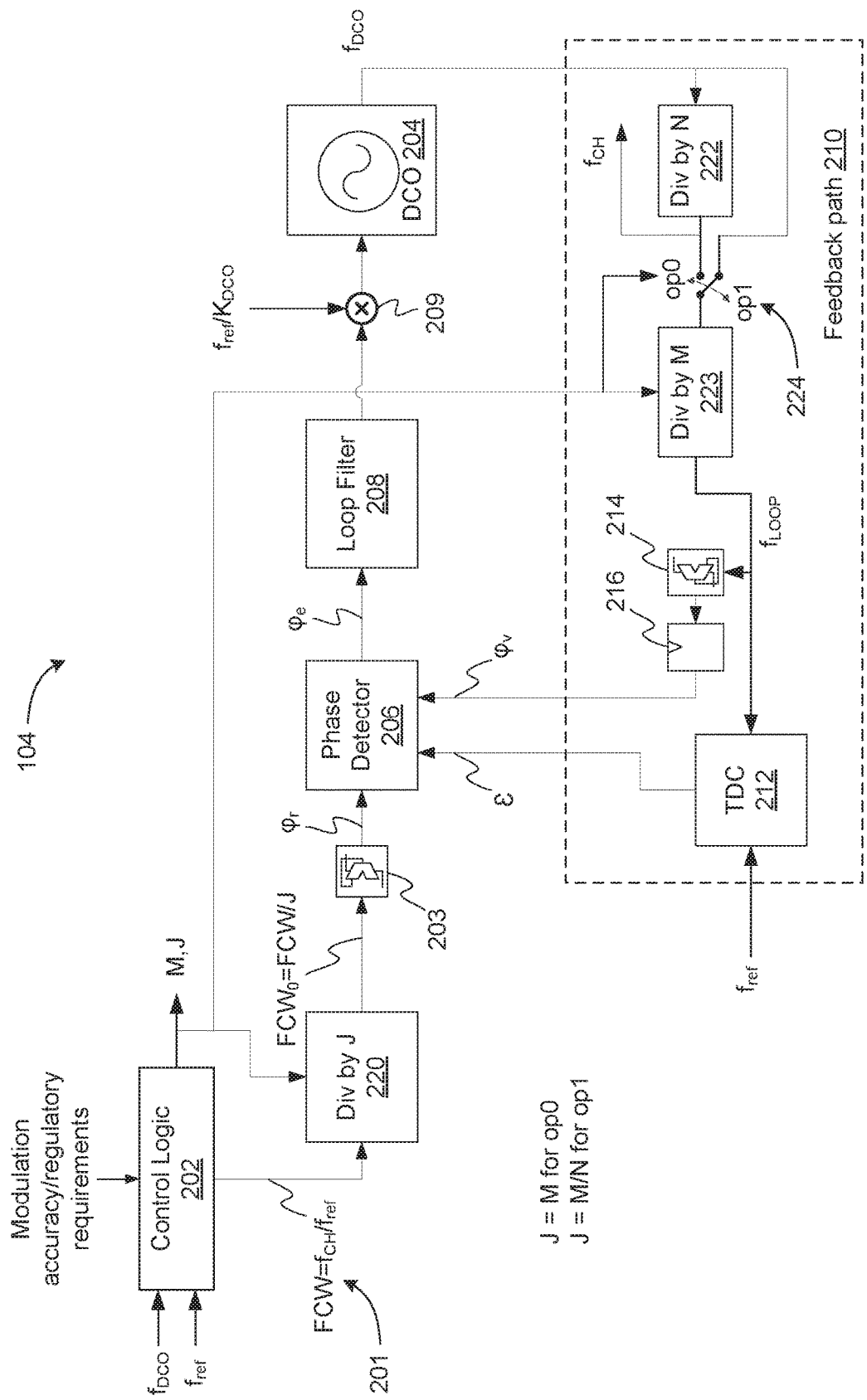
FIG. 2 is a block diagram illustrating an exemplary digital phase-locked loop configured for spur relocation.

FIG. 2 is a block diagram illustrating an exemplary digital phase-locked loop 104 configured for spur relocation. The ADPLL 104 is a control system that generates an output frequency signal in accordance with a frequency command word 201. Frequency command word 201 may be a representation of a relationship between a channel frequency $f_{CH}$ and a reference frequency $f_{ref}$. The ADPLL 104 may automatically raise or lower the frequency of a digitally controlled oscillator (DCO) 204 based on stored frequency command words corresponding to the various communication frequencies and frequency bands utilized by communication device 102. To this end, the ADPLL 104 further includes a phase detector 206, a loop filter 208, and a feedback path 210.

In one exemplary implementation, frequency command word 201 undergoes frequency to phase conversion performed by accumulator 203. As a result of this conversion, a reference phase signal $\varphi_r$, along with a feedback phase signal $\varphi_v$, are both received at the phase detector 206. The feedback phase signal $\varphi_v$ is obtained by converting a frequency signal $f_{DCO}$ generated by the DCO 204, into a digital phase signal using the feedback path 210, which includes accumulator 214 to perform the frequency to phase conversion. The phase detector 206 may be a digital logic that generates a phase error signal $\varphi_e$, which represents the difference in phase between the digital reference phase signal $\varphi_r$ and the digital feedback phase signal $\varphi_v$ and the fractional error ε.

In one exemplary implementation, feedback path 210 converts the DCO generated frequency signal $f_{DCO}$ into the digital feedback phase signal $\varphi_v$ and the fractional error ε to be compared with the digital reference signal $\varphi_r$ at the phase detector 206. The feedback path 210 is implemented in ADPLL 104 to address temperature variation, voltage drifting, and noise in the generated frequency signal $f_{DCO}$. According to this disclosure, when phase lock is achieved, the error phase signal $\varphi_e$ should equal zero or be relatively close to zero for a type-II ADPLL.

The reference phase $\varphi_r$ may be calculated by accumulating the frequency command word (FCW) 201 at the rate of the reference frequency $f_{ref}$. In one exemplary implementation, the frequency command word 201 corresponds to the ratio between the channel frequency $f_{CH}$ and the reference frequency $f_{ref}$. The channel frequency $f_{CH}$ may be the generated frequency signal $f_{DCO}$ divided by the value N at divider 222. In one exemplary implementation, N may have a fixed value (e.g., 1, 2 or some other value), and divider 222 may serve to combat common impairments in the system, such as signal pulling. Divider 222 may be an optional component in ADPLL 104 and may not be present in certain implementations. In an exemplary implementation, where divider 222 is not present, the channel frequency $f_{CH}$ may be equal to the generated frequency $f_{DCO}$. It is to be noted that the frequency command word 201 may be an integer or a fractional number including an integer component and a fractional component. Control logic 202 may store frequency command word 201 in an associated storage component (not shown) and provides frequency command word 201 to accumulator 203 in association with a particular frequency band.

In one exemplary implementation, control logic 202 and its storage component are part of the ADPLL circuit 104. In another implementation, control logic 202 is part of the communication device 102 and the ADPLL 104 is connected to the control logic 202 via the bus 116 shown in FIG. 1. In one exemplary implementation, control logic 202 stores a plurality of frequency command words. For example, control logic 202 may store a frequency command word 201 corresponding to each particular frequency band utilized by communication device 102. The control logic 202 can change (i.e. provide a different) frequency command word when the ADPLL 104 hops (i.e. switches or changes) from one frequency channel to another, where the frequency band comprises a plurality of frequency channels.

Similar to the plurality of frequency command words, control logic 202 may store a gain d for the DCO. The gain d may be equal to the reference frequency $f_{ref}$ in units of Hertz divided by a gain value of the DCO 204, $K_{DCO}$, in units of Hertz/LSB. The control logic 202 changes (i.e. provides a different) frequency command word when the ADPLL 104 hops (i.e. switches or changes) from one frequency channel to another. Accordingly, when the ADPLL 104 hops from a first frequency to a second frequency, control logic 202 provides a new frequency command word 201 to accumulator 203, and eventually a new digital tuning word to operate the DCO 204. Control logic 202 may determine which frequency command word 201 to provide to operate ADPLL 104 via a look up table (LUT) coupled to the control logic 202 or located in the attached storage component. In one exemplary implementation, the value of fref/$K_{DCO}$ is not explicitly provided by control logic 202 and may be received from some other source in the device 102.

Thus, the signal input to the ADPLL 204 in FIG. 2 is the frequency command word 201, which defines a ratio between the desired output signal (i.e., channel frequency $f_{CH}$) of the ADPLL 104 and a reference frequency signal $f_{ref}$. In some cases, the frequency command word 201 associated with the current frequency band may have associated spurs that occur at frequencies within the band so as to degrade the performance of the communication device 102. Thus, in one implementation, ADPLL 104 includes a programmable feedback divider that can change the frequency command word 201 without affecting the output frequency of ADPLL 104. As a result, the frequency command word can be changed to a different frequency command word where the corresponding spurs will not occur at frequencies within the frequency band, without changing the output frequencies $f_{DCO}$, $f_{CH}$ or the reference frequency $f_{ref}$ of the ADPLL 104.

In one exemplary implementation, the programmable feedback divider includes a first divider 220 and a second divider 223. The first digital divider 220 divides the frequency command word 201 by a first programmable value J provided by control logic 202. The value of J may be determined by control logic 202 in order to change the frequency command word 201 to a second frequency command word. The second frequency command word may be predetermined by control logic 202, as will be described below, such that the second frequency command word will not result in any fractional spurs within the current frequency channel of interest (which may include the current communication channel or a channel utilized by any other radio in the device). Thus, based on the current frequency command word 201, control logic can determine the value of J such that when frequency command word 201 is divided by J at divider 220, the output $FCW_0$ of divider 220 will be equal to the calculated second frequency command word.

In one implementation, accumulator 203 produces the reference phase signal $\varphi_r$ by accumulating the second frequency command word $FCW_0$. The reference phase signal $\varphi_r$ is fed to the phase detector 206, where the reference phase signal $\varphi_r$ is compared with the digital feedback phase signal $\varphi_v$. The output of the phase detector 206 is the phase error signal $\varphi_e$. The phase error signal $\varphi_e$ represents the variation between the digital feedback phase signal $\varphi_v$ and the fractional error ε in comparison with the reference phase signal $\varphi_r$. The phase error signal $\varphi_e$ may be fed to the loop filter 208.

The control logic 202 determines, via the LUT for example, which frequency command word should operate the ADPLL 104 for a particular frequency band. The gain multiplication point 209 then injects the digital tuning word into the DCO 204. The DCO 204 converts the digital tuning word into an analog variable frequency signal $f_{DCO}$. A part of the generated signal $f_{DCO}$ is fed back to the phase detector 206 via the feedback path 210.

The feedback path 210 converts the variable frequency signal $f_{DCO}$ into a digital feedback phase signal $\varphi_v$ and fractional error $\varepsilon$. This variable integer phase signal and the fractional phase signal are used as inputs to the phase detector 206 to be compared to (or subtracted from) the reference phase signal $\varphi_r$ which may also have integer and fractional parts. The outcome of this comparison should approach to zero when phase lock is achieved.

In feedback path 210, the configuration is determined according to the position of switch 224. In one implementation, there are two options for the configuration of ADPLL 104. The options define the position of the switch 224, which is controlled by a control signal received from control logic 202. In option 0, representing a first mode of operation, the generated signal $f_{DCO}$ is divided by the value N at divider 222 to form channel frequency $f_{CH}$. And the channel frequency $f_{CH}$ is passed through switch 224 to divider 223. In option 1, representing a second mode of operation, the generated signal $f_{DCO}$ is passed directly through switch 224 to divider 223. Divider 223 divides the received signal (i.e., either $f_{CH}$ or $f_{DCO}$) by a second programmable value M provided by control logic 202. The value of M may be determined by control logic 202 in order to generate a feedback loop frequency $f_{LOOP}$. Thanks to the adjustment done by digital divider 220, $f_{LOOP}$ does not have to be equal to the channel frequency, $f_{CH}$. The value of $f_{LOOP}$ determines the locations of the spurs and is adjustable by block 223. The value of M may be set according to the mode of operation of ADPLL 104. For example, in option 0, the second programmable value M may be equal to the first programmable value J used at divider 220. In option 1, the second programmable value M may be equal to the product of the first programmable value J and the constant value N used by divider 222. The output of divider 223 (i.e., $f_{LOOP}$) is provided to accumulator 214 for frequency-to-phase conversion and to flip-flop 216.

Furthermore, the reference signal $f_{ref}$ and the feedback loop frequency $f_{LOOP}$ in the ADPLL 104 may be different frequencies and their rising edges may not be synchronized. Accordingly, the feedback loop frequency $f_{LOOP}$ along with the reference signal $f_{ref}$ may be fed to time-to-digital converter (TDC) 212. The TDC 212 may be implemented in different forms, for example, one implementation uses an array of inverters with one inverter delay as a quantization step. The TDC 212 is configured to measure the fractional error $\varepsilon$. For each ADPLL feedback loop cycle, the TDC 212 can store the fractional error $\varepsilon$ in an associated storage component. The TDC 212 measures the time in between the closest rising edge of the reference clock and the clock in the feedback loop. This time difference is normalized by the period of $f_{LOOP}$ such that it is a fractional number less than or equal to 1 and is represented by the fractional error $\varepsilon$.

Figure 3:
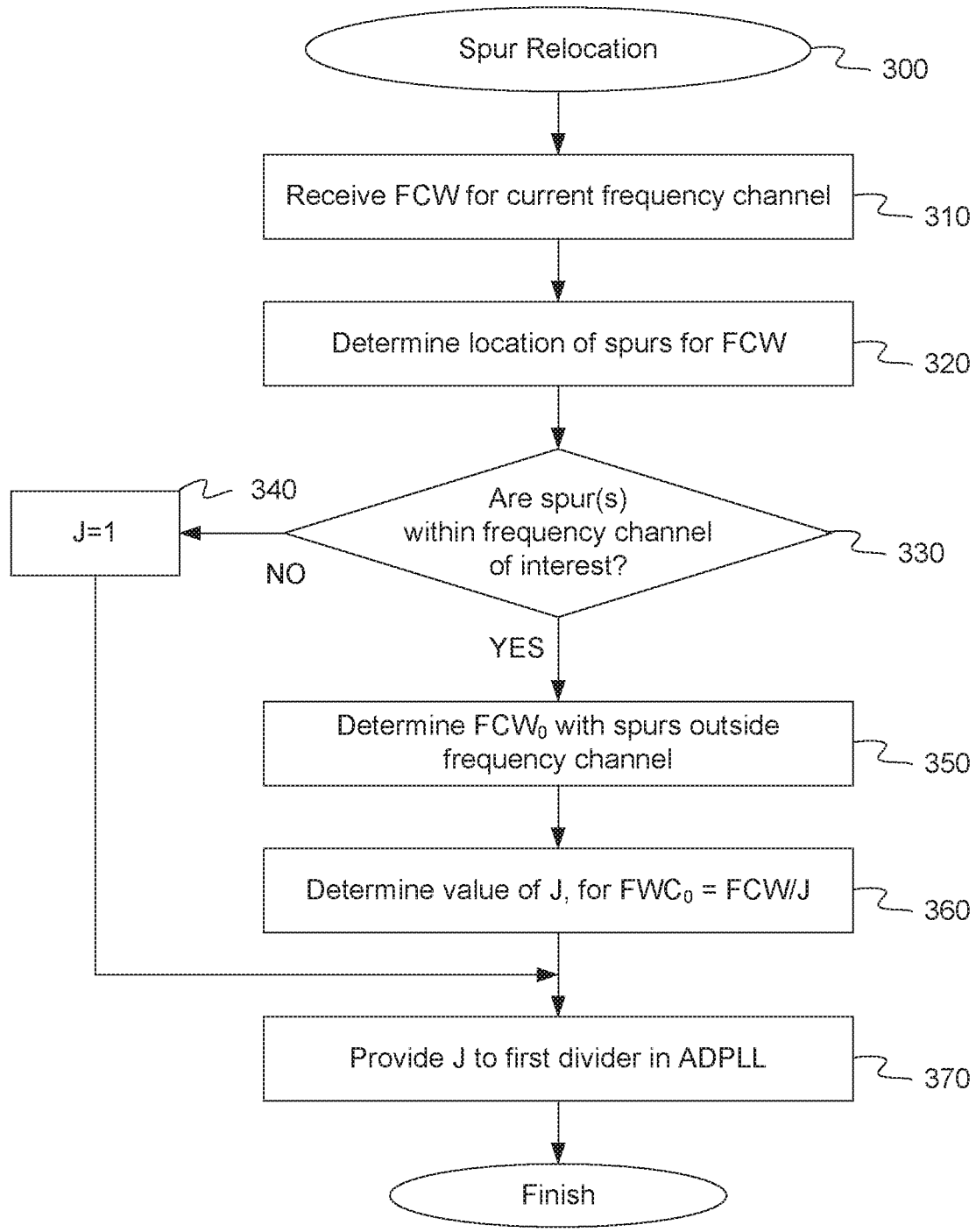
FIG. 3 is a flow diagram illustrating a method for spur relocation in a digital phase-locked loop.

FIG. 3 is a flow diagram illustrating an exemplary method for spur relocation in a digital phase-locked loop. The method 300 may be performed by processing logic that may comprise hardware (e.g., circuitry, dedicated logic, programmable logic, microcode, etc.), software (e.g., instructions run on a processing device to perform hardware simulation), firmware or a combination thereof. The processing logic may relocate fractional spurs attributable to a phase-locked loop (PLL) in a mobile communication device. In one implementation, the method 300 is performed by ADPLL 104, as shown in FIGS. 1 and 2.

Referring to FIG. 3, at block 310, method 300 receives, as an input to a digital phase-locked loop 104, a first frequency command word FCW corresponding to a first frequency channel. First frequency command word FCW may be a predetermined, preconfigured or default frequency command word associated with the first frequency channel. Control logic 202 may store the first frequency command word in an associated data store. As described above, the first frequency command word may represent a ratio of the channel frequency $f_{CH}$ and a reference frequency $f_{ref}$ for the ADPLL 104. Thus, the FCW may be set according to the desired channel or available reference frequencies in the ADPLL 104.

At block 320, method 300 determines a first frequency at which a first fractional spur associated with the first frequency command word will occur. Depending on the channel frequency and the resulting fractionality in the FCW, spurs can be generated at certain frequencies relative to the DCO frequency. Using a set of algorithms described below with respect to FIGS. 4-5B, control logic 202 can calculate the location of these fractional spurs for a given FCW.

At block 330, method 300 determines whether the first frequency is within the frequency channel of interest. If the spurs occur in the frequency channel currently being used for communications, performance can be degraded. In one implementation, control logic 202 compares the frequency determined at block 320 to a frequency or range of frequencies representing the current frequency channel to determine if the first fraction spur will fall within the frequency channel of interest. In one implementation, control logic 202 can also improve coexistence in device 102 by determining whether the frequency of the first fractional spur falls within the bandwidth being utilized by any other communications system on the device. For example, if the primary frequency channel is being utilized by a WIFI™ radio, moving the fractional spur to another frequency that falls within a frequency channel being utilized by a Bluetooth radio, may cause a degradation in performance for that radio, and vice versa. Thus, the control logic 202 may seek to move the fractional spur to a frequency that falls outside the frequency bandwidth being utilized by any radio in the device 102.

If the first frequency is not within the frequency channel, at block 340, method 300 can maintain the first frequency command word by setting a first programmable value J equal to one (i.e., J=1). As a result, the original FCW will be converted to a phase and applied to the input of phase detector 206.

If the first frequency is within the frequency channel of interest, at block 350, method 300 determines a second frequency command word $FCW_0$, where a second fractional spur associated with $FCW_0$ will occur at a second frequency outside the frequency channel. Control logic 202 can iterate through various combinations of frequencies and programmable divider values using the set of algorithms described below with respect to FIGS. 4-5B, to calculate the locations of these fractional spurs for different scenarios. Control logic 202 can store a record of each frequency command word and the corresponding location of each fractional spur in a look-up table. Control logic 202 can consult the look-up table to identify a frequency command word $FCW_0$ which will not have fractional spurs with negative effects to the main radio or the neighboring radios under consideration.

At block 360, method 300 determines a value for the first programmable value J, such that the second frequency command word $FCW_0$ equals the first frequency command word FCW divided by J. At block 370, method 300 provides the first programmable value J (from either block 340 or 360) to a first programmable feedback divider 220 in ADPLL 104. The first divider 220 divides the first frequency command word FCW by the first programmable value J to generate the second frequency command word $FCW_0$. Depending on the implementation, method 400 may also provide a second programmable value to a second divider 223, the second divider 223 to divide an output of the digitally controller oscillator 204 in the digital phase-locked loop 104 by the second programmable value to generate a feedback loop frequency $f_{LOOP}$.

Figure 4:
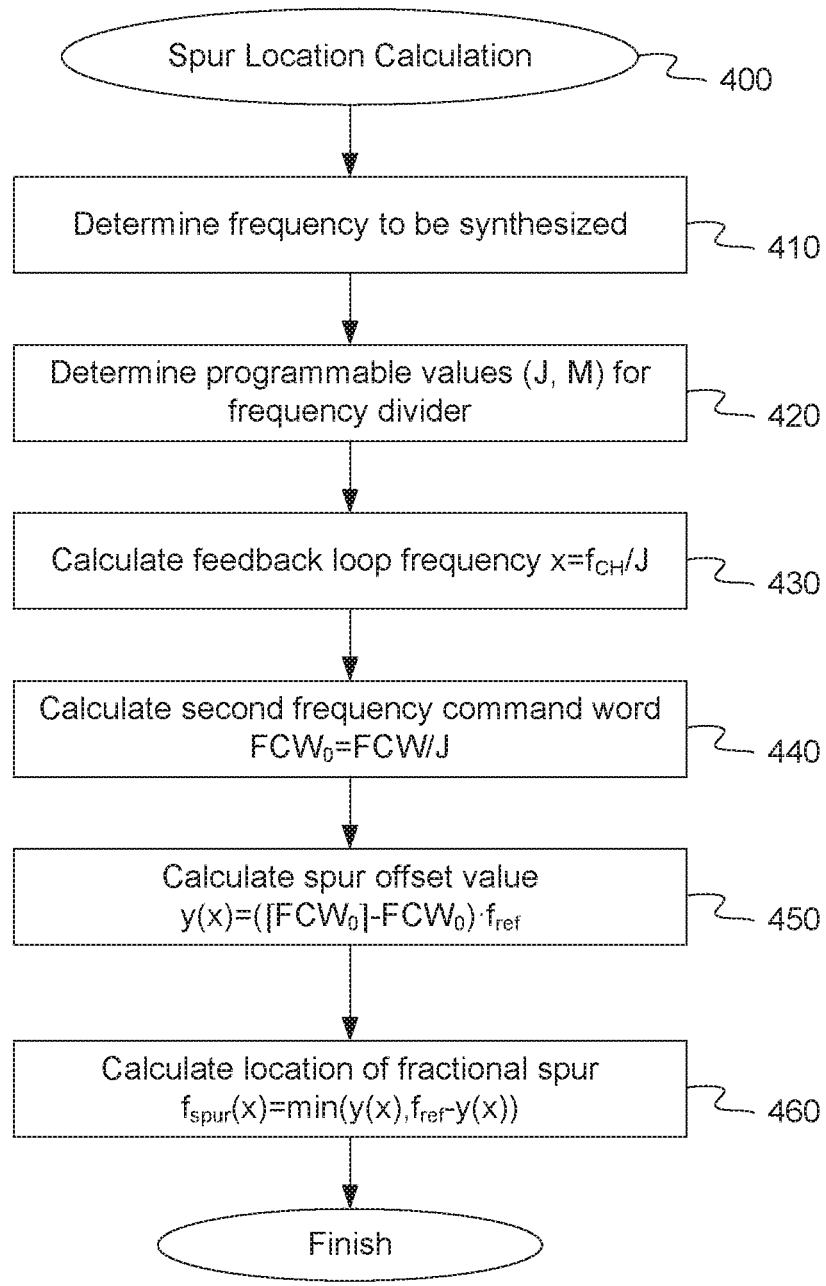
FIG. 4 is a flow diagram illustrating a method for calculating the location of a fractional spur in a digital phase-locked loop.

FIG. 4 is a flow diagram illustrating a method for calculating the location of a fractional spur in a digital phase-locked loop. The method 400 may be performed by processing logic that may comprise hardware (e.g., circuitry, dedicated logic, programmable logic, microcode, etc.), software (e.g., instructions run on a processing device to perform hardware simulation), firmware or a combination thereof. The processing logic may calculate the expected frequency at which a fractional spur will occur for a given frequency command word in a digital phase-locked loop. In one implementation, the method 400 is performed by ADPLL 104, as shown in FIGS. 1 and 2.

Referring to FIG. 4, at block 410, method 400 determines the frequency to be synthesized. An example is illustrated in and will be described with respect to FIGS. 5A and 5B. In this example, the channel frequency $f_{CH}$ is 2458 megahertz (MHz) and the reference frequency $f_{ref}$ for the ADPLL 104 is 38.4 MHz.

At block 420, method 400 determines programmable values J and M for the programmable frequency divider in ADPLL 104. For purposes of this example, the programmable values J and M are both equal to 1.

At block 430, method 400 calculates the feedback loop frequency $f_{LOOP}$, where the variable x represents $f_{Loop}$. Using the equation of $x=f_{CH}/J$, control logic 202 can determine that x=2458 MHz.

At block 440, method 400 calculates the second frequency command word $FCW_0$. Using the equation of $FCW_0=x/f_{ref}$, control logic 202 can determine that $FCW_0$=2458/38.4=64.0104.

At block 450, method 400 calculates the spur offset value y(x). Using the equation of $y(x)=(\lceil FCW_0 \rceil - FCW_0) \cdot f_{ref}$, where the top brackets represent a ceiling function that rounds the value up to the nearest integer, control logic 202 can determine that y(x)=(65−64.0104)·38.4=38.

Figure 5A:
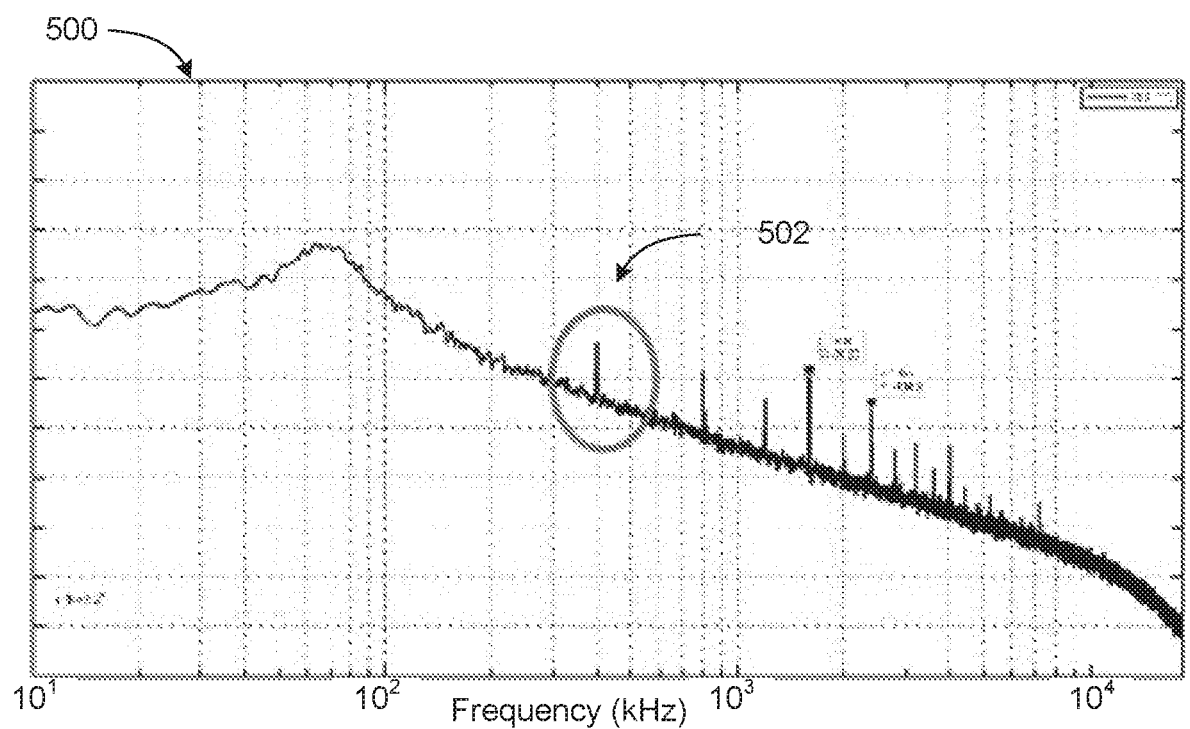
FIG. 5A is a diagram illustrating phase noise in the frequency band before spur relocation.

At block 460, method 400 calculates the location of the fractional spur $f_{spur}(X)$. Using the equation of $f_{spur}(x)$=min(y(x), $f_{ref}$−y(x))=min(38, 0.4)=0.4 MHz. Thus, a fractional spur can be expected every 0.4 MHz from the center frequency of 2458 MHz. FIG. 5A is a diagram illustrating phase noise in the frequency band before spur relocation. As shown in graph 500, a first fractional spur 502 is present at a frequency offset of 0.4 MHz. For a certain frequency channel, such as a Bluetooth communication channel having a modulation bandwidth of ±0.5 MHz from the center frequency, the first fractional spur 502 would be present within the desired frequency bandwidth.

At such near integer channels, the level of the spurs might exceed the limits set forth by a regulatory requirements especially because their location is close to the loop bandwidth at which an ADPLL is typically run. As a result, this spur is not attenuated by the closed loop as much as other channels/FCW values. This can have adverse effects on the modulation fidelity and the interference caused by the transmitter (that affects the regulatory Tx-Mask compliance) and might significantly limit the maximum transmit power. This issue can be mitigated by the control logic that adjusts the M and J values such that the location of the spurs can be moved elsewhere, preferably, out of the modulation bandwidth and to a location preferable to regulatory requirements. The preferred location can be calculated as described above and for each channel, appropriate M and J values can be chosen depending on the circumstances with coexistence or modulation fidelity.

Figure 5B:
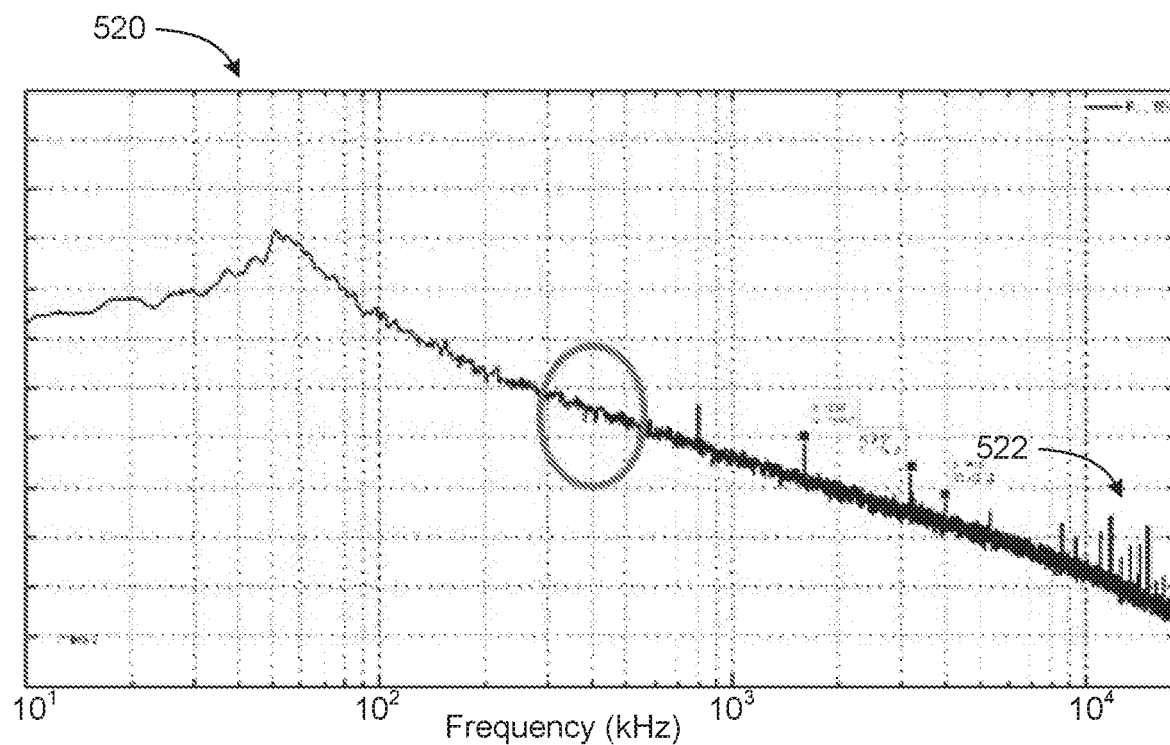
FIG. 5B is a diagram illustrating phase noise in the frequency band after spur relocation.

Since the first fractional spur 502 is within the frequency channel, it may be desirable to relocate the spur 502 by modifying the frequency command word FCW. By setting the first programmable value J=3/2 and the second programmable value M=3, a second frequency command word $FCW_0$ can be generated by divider 220 without affecting the channel frequency $f_{CH}$=2458 MHz and the reference frequency $f_{ref}$=38.4 MHz, but which moves the fractional spurs to a different location. In this case, $x=f_{CH}/J$=2458/(3/2) =1638.6667. $FCW_0=x/f_{ref}$=42.67. The spur offset value $y(x)=(\lceil FCW_0 \rceil - FCW_0) \cdot f_{ref}$=(43−42.67)·38.4=12.5 MHz. $f_{spur}(x)$=min(y(x), $f_{ref}$−y(x))=min(12.5, 25.866)=12.5 MHz. Thus, in this example, a fractional spur can be expected every 12.5 MHz from the center frequency of 2458 MHz. FIG. 5B is a diagram illustrating the phase noise in the frequency band after spur relocation. As shown in graph 520, a second fractional spur 522 is present at a frequency offset of 12.5 MHz. For a certain frequency channel having a modulation bandwidth of ±0.5 MHz from the center frequency, the second fractional spur 522 is now located well outside the frequency channel. This can be very useful in improving the modulation fidelity, such as bit-error-rate (BER) for the receiver, or Error Vector Magnitude (EVM) by moving the spurs out of band.

Figure 6:
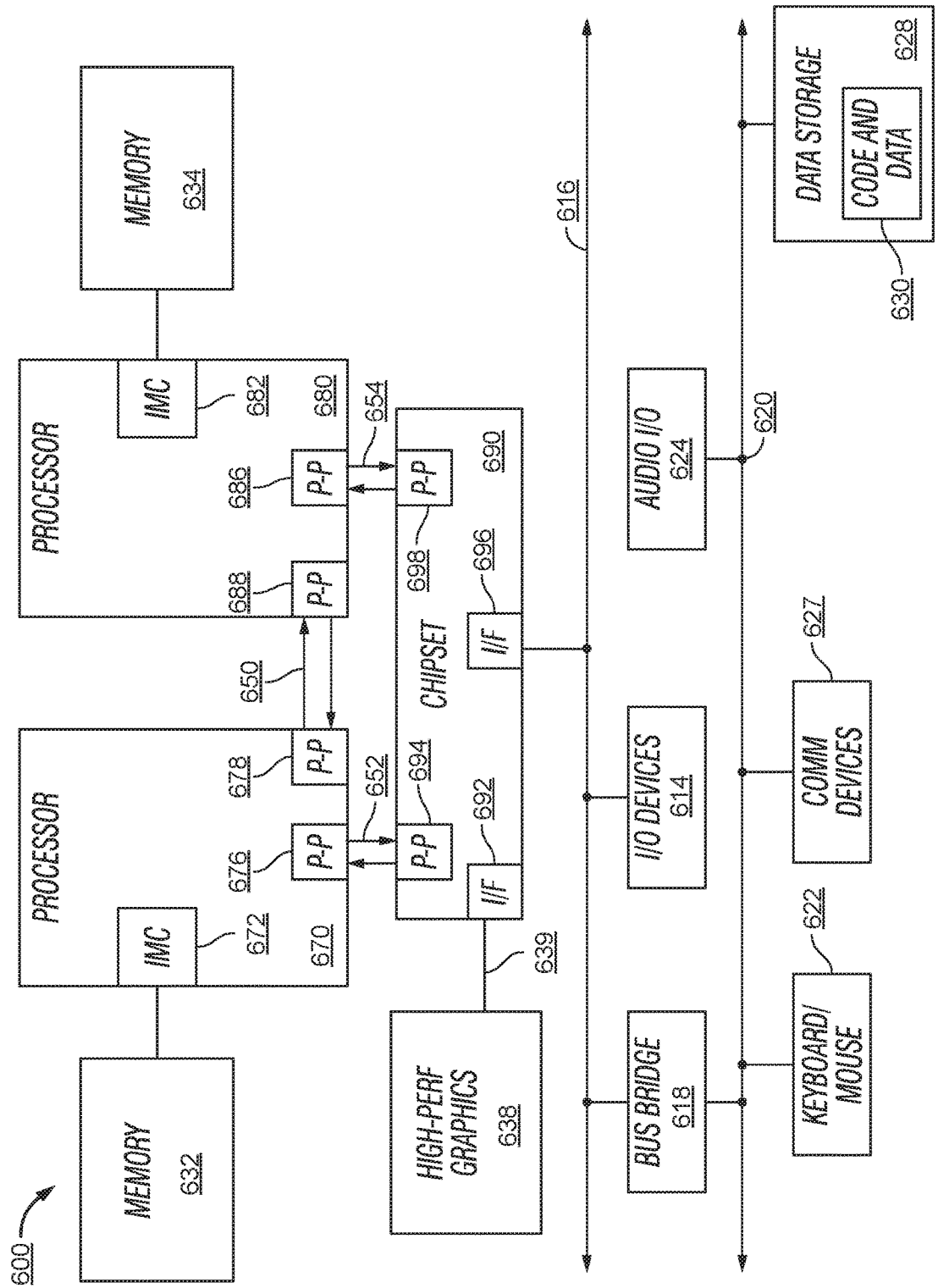
FIG. 6 is a block diagram illustrating a computer system.

Referring now to FIG. 6, shown is a block diagram of a system 600 in accordance with an implementation. As shown in FIG. 6, multiprocessor system 600 is a point-to-point interconnect system, and includes a first processor 670 and a second processor 680 coupled via a point-to-point interconnect 650. Each of processors 670 and 680 may be some version of the processing device 110, as shown in FIG. 1.

While shown with only two processors 670, 680, it is to be understood that the scope of the present disclosure is not so limited. In other implementations, one or more additional processors may be present in a given processor.

Processors 670 and 680 are shown including integrated memory controller units 672 and 682, respectively. Processor 670 also includes as part of its bus controller units point-to-point (P-P) interfaces 676 and 678; similarly, second processor 680 includes P-P interfaces 686 and 688. Processors 670, 680 may exchange information via a point-to-point (P-P) interface 650 using P-P interface circuits 678, 688. As shown in FIG. 6, integrated memory controllers (IMCs) 672 and 682 couple the processors to respective memories, namely a memory 632 and a memory 634, which may be portions of main memory locally attached to the respective processors.

Processors 670 and 680 may each exchange information with a chipset 690 via individual P-P interfaces 652, 654 using point to point interface circuits 676, 694, 686, 698. Chipset 690 may also exchange information with a high-performance graphics circuit 638 via a high-performance graphics interface 639.

A shared cache (not shown) may be included in either processor or outside of both processors, yet connected with the processors via P-P interconnect, such that either or both processors' local cache information may be stored in the shared cache if a processor is placed into a low power mode.

Chipset 690 may be coupled to a first bus 616 via an interface 696. In one implementation, first bus 616 may be a Peripheral Component Interconnect (PCI) bus, or a bus such as a PCI Express bus or another third generation I/O interconnect bus, although the scope of the present disclosure is not so limited.

As shown in FIG. 6, various I/O devices 614 may be coupled to first bus 616, along with a bus bridge 618 which couples first bus 616 to a second bus 620. In one implementation, second bus 620 may be a low pin count (LPC) bus. Various devices may be coupled to second bus 620 including, for example, a keyboard and/or mouse 622, communication devices 627 and a storage unit 628 such as a disk drive or other mass storage device which may include instructions/code and data 630, in one implementation. Further, an audio I/O 624 may be coupled to second bus 620. Note that other architectures are possible. For example, instead of the point-to-point architecture of FIG. 6, a system may implement a multi-drop bus or other such architecture.

The following examples pertain to further exemplary implementations.

Example 1 is a method for performing spur relocation for a digital phase-locked loop in a mobile communication device, comprising: 1) receiving a first frequency command word corresponding to a first frequency channel of interest; 2) identifying a first frequency at which a first fractional spur associated with the first frequency command word starts to occur; 3) determining whether the first frequency is within the first frequency channel of interest; and 4) if the first frequency is within the first frequency channel of interest, changing the first frequency command word to a second frequency command word associated with a second fractional spur that occurs at a second frequency outside the first frequency channel of interest.

In Example 2, the method of Example 1 can optionally include the first frequency channel of interest comprising at least one of a current communication channel for a first radio associated with the digital phase-locked loop or another communication channel utilized by a second radio in the mobile communication device.

In Example 3, the method of Example 1 can optionally include the first frequency command word representing a ratio between an output frequency of the digital phase-locked loop and a reference frequency and the second frequency command word comprising a second fractional component different from a first fractional component of the first frequency command word.

In Example 4, the method of Example 1 can optionally include identifying a first programmable value for the programmable feedback divider from a data store comprising a plurality of programmable values, wherein the first programmable value corresponds to the second frequency command word, and wherein each of the plurality of programmable values correspond to a different frequency command word.

In Example 5, the method of Example 4 can optionally include changing the first frequency command word to a second frequency command word comprising adjusting a programmable feedback divider in the digital phase-locked loop, the adjustable programmable feedback divider comprising a first divider and a second divider.

In Example 6, the method of Example 5 can optionally include adjusting the programmable feedback divider comprising providing the first programmable value to the first divider, the first divider to divide the first frequency command word by the first programmable value to generate the second frequency command word and providing a second programmable value to the second divider, the second divider to divide an output of the digitally controller oscillator in the digital phase-locked loop by the second programmable value to generate a programmable feedback loop frequency.

Example 7 is a mobile communication device adapted to perform spur relocation for a digital phase-locked loop, comprising: 1) a receiver to determine a first frequency channel of interest and to identify a first frequency command word corresponding to the first frequency channel of interest; 2) control logic circuitry to identify a first frequency at which a first fractional spur associated with the first frequency command word starts to occur and to determine whether the identified first frequency is within the first frequency channel of interest; and 3) a programmable feedback divider to change the first frequency command word to a second frequency command word, wherein a second fractional spur associated with the second frequency command word occurs at a second frequency outside the first frequency channel of interest.

In Example 8, the mobile communication device of Example 7 can optionally include the first frequency command word representing a ratio between an output frequency of the digital phase-locked loop and a reference frequency.

In Example 9, the mobile communication device of Example 7 can optionally include the second frequency command word comprising a second fractional component different from a first fractional component of the first frequency command word.

In Example 10, the mobile communication device of Example 7 can optionally include the control logic circuitry to identify a first programmable value for the programmable feedback divider from a data store comprising a plurality of programmable values, wherein the first programmable value corresponds to the second frequency command word, and wherein each of the plurality of programmable values correspond to a different frequency command word.

In Example 11, the mobile communication device of Example 10 can optionally include the digital phase-locked loop comprising: 1) a phase detector; 2) a loop filter coupled to the phase detector; 3) a digitally controlled oscillator coupled to the loop filter; and 4) a feedback path coupled to the digitally controlled oscillator and the phase detector.

In Example 12, the mobile communication device of Example 11 can optionally include the programmable feedback divider comprising a first divider coupled to an input of the phase detector, the first divider to divide the first frequency command word by the first programmable value provided by the control logic to generate the second frequency command word.

In Example 13, the mobile communication device of Example 12 can optionally include the programmable feedback divider comprising a second divider in the feedback path, the second divider to divide an output of the digitally controller oscillator by a second programmable value provided by the control logic to generate a feedback loop frequency.

In Example 14, the mobile communication device of Example 13 can optionally include the second programmable value being equal to the first programmable value in a first mode of operation.

In Example 15, the mobile communication device of Example 13 can optionally include the second programmable value being equal to a product of the first programmable value and a constant in a second mode of operation.

Example 16 is an apparatus comprising a digital phase-locked loop to receive a frequency command word corresponding to a first frequency channel of interest and generate an output frequency based on the frequency command word, the digital phase-locked loop comprising: 1) means for determining that a first frequency at which a first fractional spur associated with a first frequency command word occurs is within the first frequency channel of interest; and 2) means for modifying the first frequency command word to move the first fractional spur to a second frequency outside the first frequency channel of interest without affecting the output frequency.

In Example 17, the apparatus of Example 16 can optionally include the frequency command word representing a ratio between the output frequency of the digital phase-locked loop and a reference frequency.

In Example 18, the apparatus of Example 16 can optionally include modifying the first frequency command word comprising changing a first fractional component of the first frequency command word to a second fractional component that is different than the first fractional component.

In Example 19, the apparatus of Example 16 can optionally include the digital phase-locked loop further comprising means for identifying a first programmable value for a programmable feedback divider from a data store comprising a plurality of programmable values, wherein the first programmable value corresponds to the second frequency command word, and wherein each of the plurality of programmable values correspond to a different frequency command word.

In Example 20, the apparatus of Example 19 can optionally include the means for modifying the first frequency command word comprising a first divider to divide the first frequency command word by the first programmable value.

Example 21 is an apparatus comprising: 1) a memory; and 2) a computing system coupled to the memory, wherein the computing system is configured to perform the method of at least one of the Examples 1-6.

In Example 22, the apparatus of Example 21 can optionally include the computing system comprising a processing device.

Example 23 is an apparatus comprising means to perform a method as described in any preceding Example.

Example 24 is at least one machine readable medium comprising a plurality of instructions, when executed, to implement a method or realize an apparatus as described in any preceding Example.

The algorithms presented herein are not inherently related to any particular computer or other apparatus. Various general-purpose systems may be used with programs in accordance with the teachings herein, or it may prove convenient to construct a more specialized apparatus to perform the operations. The required structure for a variety of these systems will appear from the description below. In addition, the present implementations are not described with reference to any particular programming language. It will be appreciated that a variety of programming languages may be used to implement the teachings of the implementations as described herein.

The above description sets forth numerous specific details such as examples of specific systems, components, methods and so forth, in order to provide a good understanding of several implementations. It will be apparent to one skilled in the art, however, that at least some implementations may be practiced without these specific details. In other instances, well-known components or methods are not described in detail or are presented in simple block diagram format in order to avoid unnecessarily obscuring the present implementations. Thus, the specific details set forth above are merely exemplary. Particular implementations may vary from these exemplary details and still be contemplated to be within the scope of the present implementations.

It is to be understood that the above description is intended to be illustrative and not restrictive. Many other implementations will be apparent to those of skill in the art upon reading and understanding the above description. The scope of the present implementations should, therefore, be determined with reference to the appended claims, along with the full scope of equivalents to which such claims are entitled.

What is claimed is:

1. A method for performing spur relocation for a digital phase-locked loop in a mobile communication device, comprising:
   receiving a first frequency command word corresponding to a first frequency channel of interest;
   identifying a first frequency at which a first fractional spur associated with the first frequency command word starts to occur;
   determining whether the first frequency is within the first frequency channel of interest;
   when the first frequency is within the first frequency channel of interest, determining a second frequency command word associated with a second fractional spur that occurs at a second frequency outside the first frequency channel of interest; and
   changing the frequency command word to the second frequency command word using a first programmable value, wherein a first divider of a programmable feedback divider divides the first frequency command word by the first programmable value to generate the second frequency command word, wherein a second divider of the programmable feedback divider divides an output of the digital phase-locked loop by a second programmable value, and wherein the second programmable value is equal to a product of the first programmable value and a constant in a first mode of operation.

2. The method of claim 1, wherein the first frequency channel of interest comprises at least one of a current communication channel for a first radio associated with the digital phase-locked loop or another communication channel utilized by a second radio in the mobile communication device.

3. The method of claim 1, wherein the first frequency command word represents a ratio between an output frequency of the digital phase-locked loop and a reference frequency and wherein the second frequency command word comprises a second fractional component different from a first fractional component of the first frequency command word.

4. The method of claim 1 further comprising:
   adjusting the programmable feedback divider in the digital phase-locked loop to change the first frequency command word to the second frequency command word, the adjustable programmable feedback divider comprising a first divider and a second divider.

5. The method of claim 4, wherein adjusting the programmable feedback divider comprises providing the first programmable value to the first divider, the first divider to divide the first frequency command word by the first programmable value to generate the second frequency command word and providing the second programmable value to the second divider, the second divider to divide an output of a digitally controller oscillator in the digital phase-locked loop by the second programmable value to generate a programmable feedback loop frequency.

6. A mobile communication device adapted to perform spur relocation for a digital phase-locked loop, comprising:
a receiver configured to determine a first frequency channel of interest and to identify a first frequency command word corresponding to the first frequency channel of interest;
control logic circuitry configured to:
identify a first frequency at which a first fractional spur associated with the first frequency command word starts to occur;
determine whether the identified first frequency is within the first frequency channel of interest; and
when the identified first frequency is within the first frequency channel of interest, determine a second frequency command word associated with a second fractional spur that occurs at a second frequency outside the first frequency channel of interest; and
a programmable feedback divider comprising a first divider and a second divider and configured to change the first frequency command word to the second frequency command word using a first programmable value, wherein the first divider is configured to divide the first frequency command word by the first programmable value provided by the control logic to generate the second frequency command word, wherein the second divider is configured to divide an output of the digital phase-locked loop by a second programmable value provided by the control logic circuitry, and wherein the second programmable value is equal to the first programmable value in a first mode of operation.

7. The mobile communication device of claim 6, wherein the first frequency command word represents a ratio between an output frequency of the digital phase-locked loop and a reference frequency.

8. The mobile communication device of claim 6, wherein the second frequency command word comprises a second fractional component different from a first fractional component of the first frequency command word.

9. The mobile communication device of claim 6, wherein the digital phase-locked loop comprises:
a phase detector;
a loop filter coupled to the phase detector;
a digitally controlled oscillator coupled to the loop filter; and
a feedback path coupled to the digitally controlled oscillator and the phase detector.

10. The mobile communication device of claim 9, wherein the first divider is coupled to an input of the phase detector.

11. The mobile communication device of claim 10, wherein the second programmable value provided by the control logic generates a feedback loop frequency.

12. The mobile communication device of claim 11, wherein the second programmable value is equal to a product of the first programmable value and a constant in a second mode of operation.

13. An apparatus, comprising:
a memory; and
a processor in communication with the memory, wherein the processor is configured to:
receive a first frequency command word corresponding to a first frequency channel of interest;
identify a first frequency at which a first fractional spur associated with the first frequency command word starts to occur;
determine whether the first frequency is within the first frequency channel of interest;
when the first frequency is within the first frequency channel of interest, determine a second frequency command word associated with a second fractional spur that occurs at a second frequency outside the first frequency channel of interest; and
change the first frequency command word to the second frequency command word using a first programmable value, wherein a first divider of a programmable feedback divider divides the first frequency command word by the first programmable value to generate the second frequency command word, wherein a second divider of the programmable feedback divider divides an output of a digital phase-locked loop by a second programmable value, and wherein the second programmable value is equal to a product of the first programmable value and a constant in a first mode of operation.

14. The apparatus of claim 13, wherein the first frequency command word represents a ratio between an output frequency of the digital phase-locked loop and a reference frequency.

15. The apparatus of claim 13, wherein the second frequency command word comprises a second fractional component different from a first fractional component of the first frequency command word.

16. The apparatus of claim 13, wherein the second programmable value is equal the first programmable value in a second mode of operation.

17. The apparatus of claim 13, wherein changing the first frequency command word comprises changing a first fractional component of the first frequency command word to a second fractional component that is different than the first fractional component.

* * * * *